United States Patent
Syed et al.

(10) Patent No.: US 9,231,529 B2
(45) Date of Patent: Jan. 5, 2016

(54) SWITCHABLE MULTI-OUTPUT LOW-NOISE AMPLIFIER WITH DISTORTION CANCELLATION

(71) Applicant: MOTOROLA SOLUTIONS, INC, Schaumburg, IL (US)

(72) Inventors: Shafiullah Syed, Parkland, FL (US); Jiun How Ng, Puchong (MY)

(73) Assignee: Motorola Solutions, Inc., Schaumburg, IL (US)

( * ) Notice: Subject to any disclaimer, the term of this patent is extended or adjusted under 35 U.S.C. 154(b) by 63 days.

(21) Appl. No.: 14/107,135

(22) Filed: Dec. 16, 2013

(65) Prior Publication Data
US 2015/0171798 A1     Jun. 18, 2015

(51) Int. Cl.
*H03F 1/26*     (2006.01)
*H03F 1/32*     (2006.01)
(Continued)

(52) U.S. Cl.
CPC ............... *H03F 1/3223* (2013.01); *H03F 1/26* (2013.01); *H03F 3/193* (2013.01); *H03F 3/68* (2013.01); *H03F 2200/294* (2013.01); *H03F 2200/372* (2013.01); *H03F 2200/451* (2013.01);
(Continued)

(58) Field of Classification Search
CPC ............... H03F 3/68; H03F 2200/392; H03F 2200/372; H03F 2001/3206; H03F 1/3223; H03F 1/26; H03F 3/193; H03F 2200/294; H03F 2200/451; H03F 2201/3321
USPC ......... 330/51, 124 R, 295, 300, 311, 65, 127, 330/149, 151, 250, 264, 296, 307
See application file for complete search history.

(56) References Cited

U.S. PATENT DOCUMENTS

| 5,124,667 A | 6/1992 | Chevallier |
| 6,118,340 A | 9/2000 | Koen |

(Continued)

FOREIGN PATENT DOCUMENTS

| EP | 704982 A2 | 4/1996 |
| EP | 1873909 B1 | 9/2010 |
| GB | 2369508 A | 5/2002 |

OTHER PUBLICATIONS

Bruccoleri et. al. "Wide-Band CMOS Low-Noise Amplifier Exploiting Thermal Noise Canceling", Solid-State Circuits, IEEE Journal of, vol. 39, Issue: 2, Publication Year: 2004, pp. 275-282.*

(Continued)

*Primary Examiner* — Steven J Mottola
*Assistant Examiner* — Hafizur Rahman
(74) *Attorney, Agent, or Firm* — Barbara R. Doutre

(57) ABSTRACT

A low-noise amplifier is provided that includes an input amplifier stage coupled to a plurality of independently switchable output amplifier stages. The input amplifier stage is operative to amplify an input communications signal, and it provides both an amplified communications signal and a feedforward signal. The amplified communications signal and the feedforward signal both include a distortion component. Each of the switchable output stages is operative to provide an output that combines the feedforward signal with the amplified communications signal in such a way that the distortion components of the signals at least partially cancel one another. In some embodiments, the switching of the output amplifier stages is performed by circuitry that also serves to improve reverse isolation of the separate output amplifier stages.

17 Claims, 4 Drawing Sheets

(51) Int. Cl.
*H03F 3/193* (2006.01)
*H03F 3/68* (2006.01)

(52) U.S. Cl.
CPC . *H03F2201/3206* (2013.01); *H03F 2201/3221* (2013.01)

(56) References Cited

U.S. PATENT DOCUMENTS

| | | | |
|---|---|---|---|
| 6,525,601 | B2 | 2/2003 | Gilbert |
| 7,088,179 | B2 | 8/2006 | Gilbert et al. |
| 7,315,730 | B2 | 1/2008 | Galan |
| 8,102,213 | B2 * | 1/2012 | Tasic et al. .................. 330/283 |
| 2004/0145415 | A1 | 7/2004 | Sun |
| 2008/0171524 | A1 | 7/2008 | Heng |
| 2009/0075612 | A1 | 3/2009 | Keehr et al. |
| 2009/0243728 | A1 | 10/2009 | Imagawa |
| 2010/0327977 | A1 * | 12/2010 | Godbole ...................... 330/278 |
| 2012/0039096 | A1 * | 2/2012 | Dunipace ................. 363/21.12 |
| 2012/0327825 | A1 | 12/2012 | Gudem et al. |
| 2013/0176077 | A1 * | 7/2013 | Pai et al. ...................... 330/278 |

OTHER PUBLICATIONS

"Bruccoleri et al., Wide-Band CMOS Low-Noise Amplifier Exploiting Thermal Noise Canceling. IEEE Journal of Solid-State Circuits, vol. 39, No. 2, Feb. 2004, pp. 275-282".

AMZ Jfet Splitter, Website link: http://www.muzique.com/lab/splitter.htm.

Semtech, Advanced Communication & Sensing Products; SX1701—Datasheet: Highly linear wideband LNA Multi-channel, single-ended to differential conversion; Aug. 20, 2008.

* cited by examiner

SWITCHABLE MULTI-OUTPUT LOW-NOISE AMPLIFIER WITH DISTORTION CANCELLATION

BACKGROUND OF THE INVENTION

A Low-noise amplifier is typically the first active electronic component to process a radio-frequency signal received by a wireless communication device, such as a mobile telephone or two-way radio. Any noise and distortion introduced at this early stage of signal processing is likely to propagate through the receiving equipment, so it is important to select a low-noise amplifier with a low noise figure (NF) and high linearity.

There are several known design constraints that make it difficult to achieve low noise figure and high linearity while also satisfying requirements for input and output impedance matching, reverse isolation, stability, and low current consumption. These constraints are particularly difficult to satisfy where a receiver is required to have the capability of monitoring more than one wireless channel at a time, as in the case of a dual-watch radio. In such cases, it is possible to passively split the input signal and to amplify the split signal with two separate low-noise amplifiers. Alternatively, it is possible to use a single low-noise amplifier and to passively split the outputs. Both of these solutions require additional current consumption due to the need to increase gain to account for passive loss at the splitter.

Accordingly, there is a need for a switchable multi-output low-noise amplifier with distortion cancellation.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
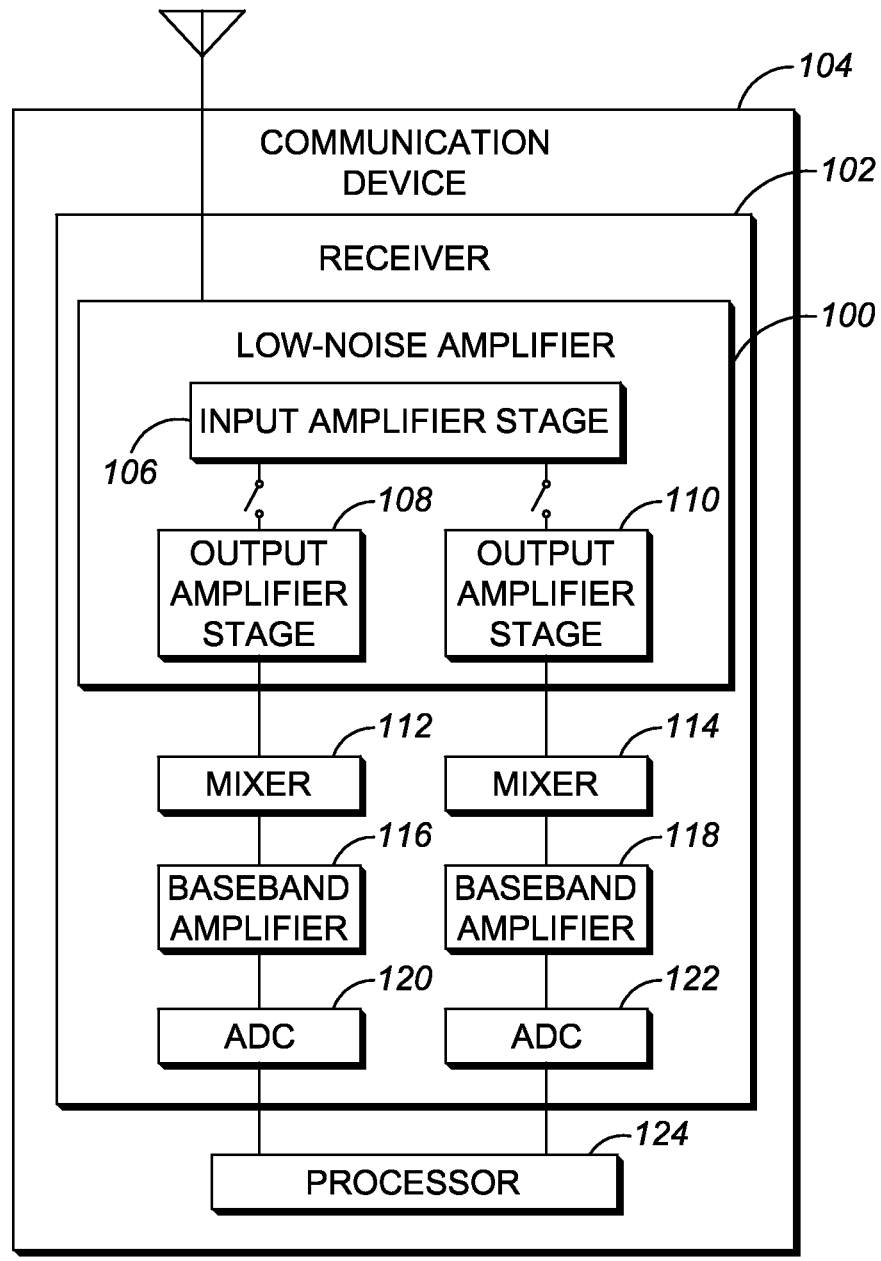
FIG. 1 is a schematic block diagram illustrating the functional architecture of a communications device in some embodiments.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

A low-noise amplifier according to some embodiments includes an input amplifier stage that is operative to amplify an input communications signal. The input amplifier stage provides both an amplified communications signal and an input feedforward signal. The amplified communications signal and the input feedforward signal both include a distortion component. The input amplifier stage is coupled to a plurality of switchable output amplifier stages. Each of the switchable output stages is operative to amplify the input feedforward signal to create an amplified feedforward signal, and to provide an output that combines the amplified feedforward signal with the amplified communications signal in such as way that the distortion components of the signals at least partially cancel one another.

The functional architecture of one potential implementation of a low-noise amplifier 100 according to some embodiments is illustrated schematically in FIG. 1. In this figure, a low-noise amplifier 100 can be used in a receiver 102 of a wireless communication device 104, which may be a dual-watch radio. The low-noise amplifier 100 includes an input amplifier stage 106 and two or more switchable output amplifier stages 108, 110. The input amplifier stage receives a radio-frequency communications input signal and amplifies the signal. The amplified signal is provided to either or both of the output amplifier stages 108, 110. As described in greater detail below, the output amplifier stages 108, 110 provide noise and distortion cancellation, output impedance matching, and reverse isolation between the two outputs.

The outputs of the output amplifier stages 108, 110 are fed to respective frequency mixers 112, 114, to downconvert the radio frequency signals to a baseband signal, which is amplified by respective baseband amplifiers 116, 118. The amplified baseband signals may be converted to digital signals by respective analog-to-digital converters 120, 122, and the digital signals can be further processed in the digital domain by a processor 124, which can direct the signals to be displayed visibly or presented audibly as appropriate by conventional components (not illustrated) of the communication device 104. For simplicity, the components of the communication device 104 that relate to the transmission of signals are not illustrated in FIG. 1. The processing of two separate outputs from the two output amplifier stages 108, 110 allows the user of communication device 104 to monitor transmissions from two radio channels at the same time.

Figure 2:
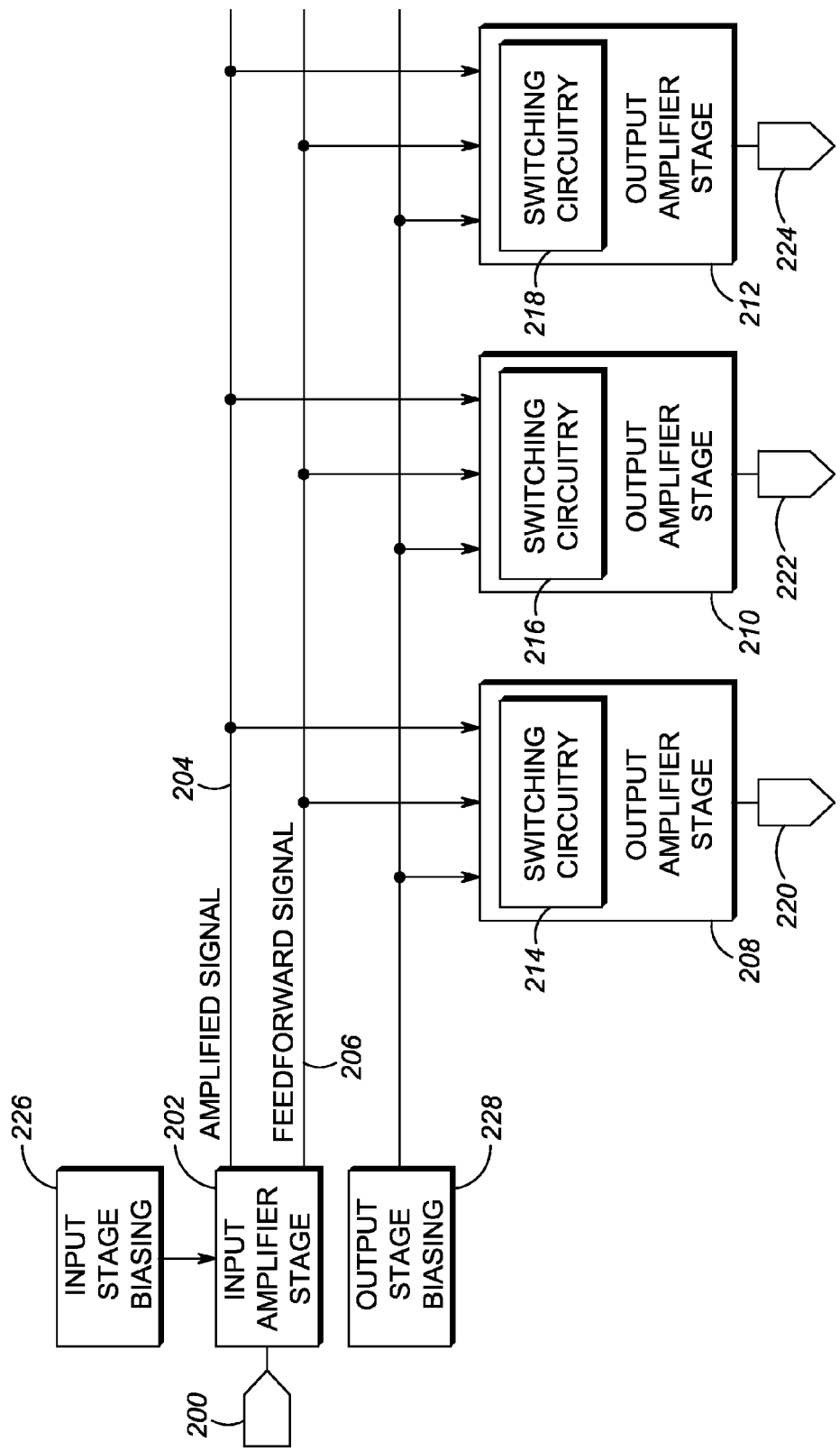
FIG. 2 is a schematic block diagram illustrating the functional architecture of a low-noise amplifier in some embodiments.

FIG. 2 provides a schematic diagram of the functional architecture of a low-noise amplifier according to some embodiments. As illustrated in FIG. 2, a radio frequency input signal is provided at an input conductor 200. An input amplifier stage 202 provides input impedance matching, and it amplifies the input signal to provide an amplified signal 204. The amplified signal 204 contains not only a scaled-up version of the input signal, but also a distortion component as a result of noise and nonlinearities in the componentry of the input amplifier stage 202. In some embodiments, the input amplifier stage 202 is an inverting amplifier.

To permit noise and distortion cancellation, the input amplifier stage 202 provides an input feedforward signal 206 that also includes a scaled-down version of the distortion component. In some embodiments, the input feedforward signal 206 also includes an uninverted component due to the input signal at the input conductor 200.

The low-noise amplifier of FIG. 2 further includes a plurality of parallel switchable output amplifier stages 208, 210, 212. The output amplifier stages include respective switching circuitry 214, 216, 218 operative to activate or deactivate individual output amplifier stages. For instance, when the low-noise amplifier is used only to monitor a single radio channel, the switching circuitry may deactivate all but one of the output amplifier stages to reduce current use. In some embodiments, deactivating one of the output amplifier stages leads to a current savings of about 5 mA. Conversely, when more than one radio channel is being monitored, the switching circuitry activates more than one output amplifier stage.

The output amplifier stages 208, 210, and 212 operate to combine the input feedforward signal 206 with the amplified signal 204 such that the distortion components of those respective signals tend to cancel out. For example, in some embodiments, the output amplifier stages are operative to amplify the input feedforward signal 206 such that the distortion component of the amplified feedforward signal is similar in magnitude to the distortion component of the amplified signal 204. The output amplifier stages are further operative to combine the signals in such a way that the distortion components tend to cancel one another, while the communication signal components tend to add together. The combined signal is provided on respective output conductors 220, 222, 224.

In the example of FIG. 2, biasing of amplifier components in the input amplifier stage 202 is provided by input stage biasing circuitry 226, while biasing of amplifier components in the output amplifier stages 208, 210, 212 is provided by output stage biasing circuitry 228. In some embodiments, the output stage biasing circuitry is 228 is separate from the input stage biasing circuitry 226, but is nevertheless shared by the several output amplifier stages 208, 210, 212.

Figure 3:
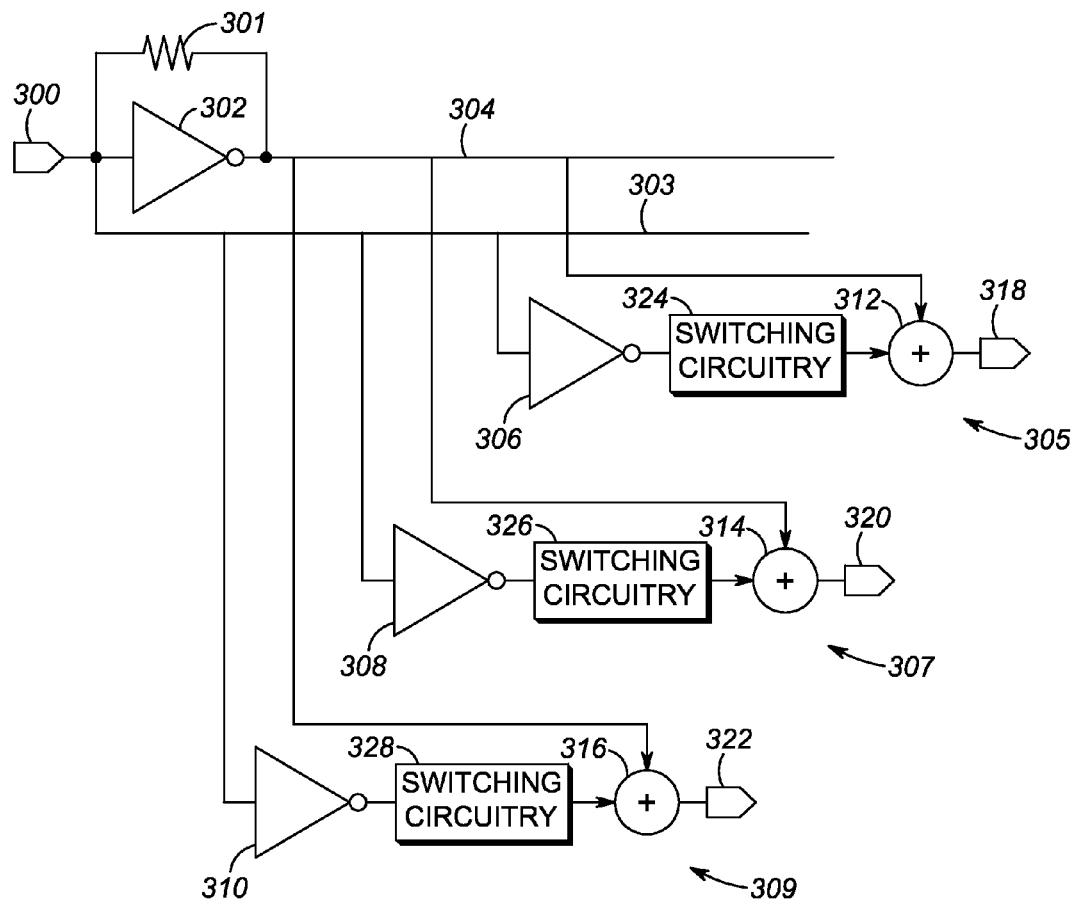
FIG. 3 is a schematic block diagram illustrating other aspects of the functional architecture of a low-noise amplifier in some embodiments.

FIG. 3 is a schematic block diagram illustrating other aspects of the functional architecture of a low-noise amplifier in some embodiments. A radio-frequency input communication signal is provided on an input conductor 300. Input amplifier circuitry is provided by an input-stage inverting amplifier 302, which amplifies the input signal and provides an amplified communication signal output on a first-stage output conductor 304. The first-stage output conductor 304 is resistively coupled to the input conductor 300 through a resistive coupling 301. In some embodiments, resistive coupling 301 includes a resistor in series with a capacitor to provide an AC coupling. Noise and nonlinear distortion components present on the output conductor 304 are fed back through resistive coupling 301 to the input conductor 300. The combination of the input communication signal on input conductor 300 and the signal fed through the resistive coupling 301 generates an input feedforward signal on a feedforward conductor 303.

Since the input-stage amplifier 302 is an inverting amplifier, the amplified communication signal at the output conductor 304 is opposite in sign (or 180° out of phase) from the input communication signal. However, noise and distortion components generated by the input-stage amplifier 302 are fed back through the resistive coupling 301, which does not change the sign (or phase) of the noise and distortion components. That is, the noise and distortion components on the input conductor 300 have the same sign as the noise and distortion components on the first-stage output conductor 304.

The system of FIG. 3 further includes a plurality of parallel output amplifier stages 305, 307, 309. The output amplifier stages include output amplifier circuitry, such as output-stage inverting amplifiers 306, 308, 310. The output-stage inverting amplifiers 306, 308, 310 are coupled to the input conductor 300. In some embodiments, the output-stage inverting amplifiers 306, 308, 310 are coupled to input conductor 300 through an AC coupling, such as a capacitor. The output-stage inverting amplifiers 306, 308, 310 separately amplify the input feedforward signal on feedforward conductor 303 to provide amplified feedforward signals. In embodiments in which the output-stage amplifiers 306, 308, 310 are inverting amplifiers, the outputs of those respective amplifiers have a sign opposite to that of the input feedforward signal.

The parallel output amplifier stages further include signal combination circuitry 312, 314, 316. The signal combination circuitry 312, 314, 316 combines the amplified communication signal 304 with the output-stage inverting amplifiers 306, 308, 310, respectively, and output the combined signals on respective output conductors 318, 320, 322.

In the system of FIG. 3, the noise and distortion components of the amplified communication signal on first-stage output conductor 304 have a sign opposite the sign of the noise and distortion components in the amplified feedforward signal. This is because the output of the amplifier 302, along with any noise and distortion, is fed directly to the signal combination circuitry 312, 314, 316, while any noise and distortion components sampled by the resistive coupling 301 pass through inverting amplifiers 306, 308, 310 before reaching the signal combination circuitry 312, 314, 316. Preferably, the gain of the amplifiers 306, 308, 310 is chosen such that noise and distortion components reaching the signal combination circuitry 312, 314, 316 have substantially the same magnitude (though opposite sign) of the noise and distortion components on the first-stage output conductor.

While the noise and distortion components tend to cancel out at the signal combination circuitry 312, 314, 316, the communication signal components tend to reinforce one another. This is because the signal combination circuitry 312, 314, 316 is combining communication signals that have both been inverted. Thus, the signal combination circuitry 312, 314, 316 operates both to increase the gain with respect to the communication signal and to cancel out noise and distortion components that are introduced by the input amplifier circuitry 302.

Between the output stage amplifier circuitry 306, 308, 310 and the signal combination circuitry 312, 314, 316 is respective switching circuitry 324, 326, 328. The switching circuitry 324, 326, 328 permits the output amplifier stages to be independently switchable by providing an amplified feedforward signal to the appropriate signal combination circuitry only when a particular output amplifiers stage is selected.

Output amplifier stages can be activated or deactivated as needed. For example, more than one output amplifier stage may be activated at a time to permit monitoring of more than one radio frequency communications channel at a time, as in a dual-watch radio. When it is not necessary to monitor more than one radio communications channel, one or more of the output amplifier stages may be deactivated to reduce current consumption and to improve isolation between channels.

In some embodiments, the switching circuitry 324, 326, 328 serves a dual role not only of activating and deactivating individual output amplifier stages, but also of improving reverse isolation even when an output amplifier stage is activated. For example, the switching circuitry 324, 326, 328 may be effective to prevent potentials at the signal combination circuitry 312, 314, 316 from inadvertently being fed back to the output stage amplifier circuitry 306, 308, 310 through parasitic capacitance or other effects.

In some embodiments, the amplifier characteristics of the different output amplifier stages 305, 307, 309 are different from one another. For example, the different amplifiers may have different power characteristics, different gain, different noise characteristics, different frequency characteristics, or different output impedances. In some embodiments the output impedances of the output amplifier stages are 305, 307, 307 are substantially equal to 50 ohms. Where the different output amplifier stages are used for monitoring different communications channels, the characteristics of the different output amplifier stages can be optimized for the channel or channels assigned to a particular output amplifier stage.

Figure 4:
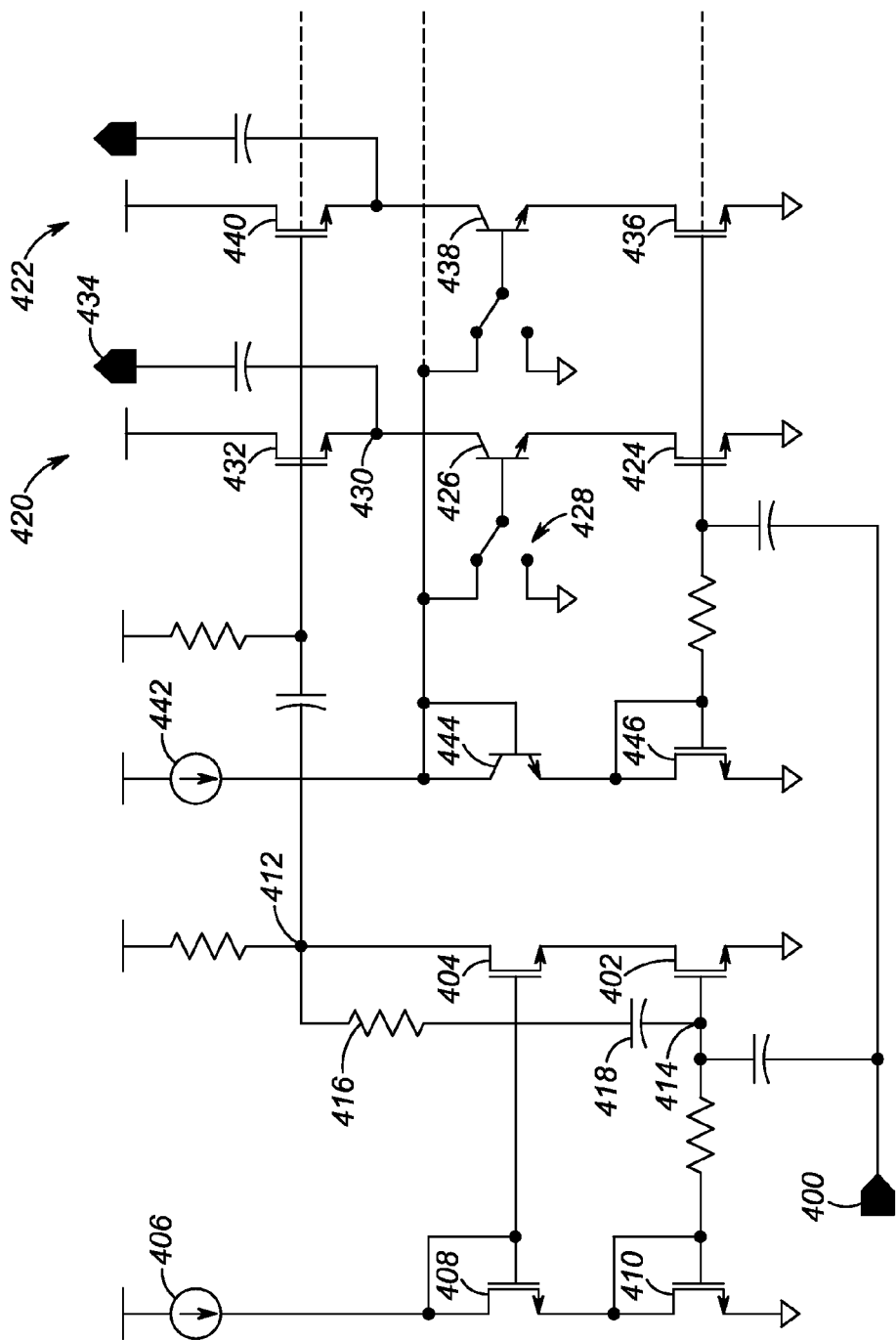
FIG. 4 is a schematic representation of implementation of a low-noise amplifier in some embodiments. Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

FIG. 4 is a schematic representation of implementation of a low-noise amplifier in some embodiments. An input communication signal is provided on an input conductor 400. The input conductor 400 is AC coupled to the gate of field-effect transistor 402, which is in a common-source configuration. The transistor 402 is arranged in a cascode configuration with field-effect transistor 404 to constitute the active components of the input amplifier circuitry. Transistors 402 and 404 are biased by input-stage biasing components, including current source 406 and transistors 408, 410. Transistors 402 and 404 provide an inverted, amplified communication signal output at node 412.

Transistors 402 and 404 may be the source of unwanted noise, such as thermal noise, and unwanted distortion, such as nonlinear components of the amplified communications signal. The potential at node 412 is resistively coupled to node 414 through resistor 416 and capacitor 418. In this way, noise and distortion signals originating from transistors 402 and 404 are communicated, at an attenuated amplitude, to node 414. At node 414, the potential then includes a component due to the communication signal at conductor 400 and a component due to noise and distortion from the transistors 402, 404.

The low-noise amplifier illustrated in FIG. 4 includes two parallel output amplifier stages 420, 422. Output amplifier stage 420 includes a field-effect transistor 424 in a common-source configuration. A switching transistor 426 has an emitter coupled to the drain of the transistor 424, such that transistors 424 and 426 are arranged in a cascode configuration. In some embodiments, the switching transistor 426 is a bipolar junction transistor. The gate of switching transistor 426 is coupled to a switch 428, which selectively brings the potential of the gate either to a biasing potential or to ground. The switch 428 may itself be comprised of solid-state digital circuitry, but for simplicity here, it is illustrated as a simple hardware switch.

The gate of the transistor 424 is capacitively coupled to the input conductor 400. Thus, when the gate of transistor 426 is raised to a biasing potential, the transistor 426 is in conduction, and transistors 424 and 426 operate as output amplifier circuitry to invert and amplify the input communication signal, including the distortion component sampled through resistor 416, to generate an amplified feedforward signal. The output of transistors 424 and 426 is provided at node 430.

When the gate potential of switching transistor 426 is brought to ground, current flow ceases through transistors 424 and 426, and output stage 420 is inactivated.

The potential at node 412 is capacitively coupled to the gate of field-effect transistor 432, which is in a source-follower configuration. The source of the source-follower transistor 432 is coupled to node 430. Thus, at node 430, the amplified feedforward signal from transistors 424, 426 is combined with the amplified communication signal from transistors 402, 404 to enhance the amplitude of the communication signal and to cancel at least a portion of the noise and distortion components generated in transistors 402, 404. Node 430 is capacitively coupled to output conductor 432 for output amplifier stage 420.

Switching transistor 426 operates not only to activate and deactivate the output amplifier stage 420, it also improves reverse isolation by preventing potentials at node 430 from feeding back to transistor 424. Transistor 426 thus helps protect against distortion due to parasitic capacitance and the Miller effect.

As illustrated in FIG. 4, another output amplifier stage 422 is provided with components analogous to those in output amplifier stage 420, such as common-emitter transistor 436, switching transistor 438, and source-follower transistor 440. However, the characteristics of the components in the different output amplifier stages may differ from one another, allowing the different output amplifier stages to be optimized for different purposes. For example, different output amplifier stages may be optimized for different communications channels. One way in which the amplifier stages may be optimized is by selecting appropriate values of the W/L ratio for the various field-effect transistors in the output amplifier stages.

In addition to the two illustrated output amplifier stages 420 and 422, any number of additional switchable output amplifier stages may also be provided.

In some embodiments, the circuitry of the output amplifier stages 420, 422 make use of common output stage biasing circuitry. In the illustration of FIG. 4, the output amplifier stages make use of common biasing circuitry comprising current source 442 and transistors 444 and 446. In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

By following the principles described herein, it is possible to achieve reverse isolation of more than 30 dB between two outputs over a wide frequency range. In general, it is possible to satisfy an 82 dB intermodulation (IM) requirement on dual outputs over a wide frequency range (100 MHz to 1 GHz) using less than 22 mW.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. An amplifier comprising:
an input amplifier stage operative to amplify an input communication signal and to provide (i) an amplified communication signal containing a scaled-up version of the input communication signal and a distortion component and (ii) an input feedforward signal containing a scaled-down version of the distortion component; and
a plurality of switchable output amplifier stages, wherein each switchable output amplifier stage of the switchable output amplifier stages is operative to:
(i) amplify the input feedforward signal to create an amplified feedforward signal and to combine the amplified feedforward signal with the amplified communication signal so as to at least partially cancel the distortion component on an output conductor; and
(ii) activate and deactivate, via switching circuitry that is brought correspondingly into or out of conduction, the switchable output amplifier stage.

2. The amplifier of claim 1, wherein each of the switchable output amplifier stages is switched by a switching transistor that has a collector coupled to the output conductor.

3. The amplifier of claim 2, wherein a base of the switching transistor is alternatively coupleable to a current source or to ground, thereby bringing the switching transistor into or out of conduction, respectively.

4. An amplifier comprising:
an input conductor for conducting an input communication signal;
input amplifier circuitry operative to amplify the input communication signal and to provide an amplified communication signal output to a first-stage output conductor, wherein the first-stage output conductor is resistively coupled to the input conductor; and
a plurality of parallel output amplifier stages, wherein each of the output amplifier stages includes:
signal combination circuitry coupled to the first-stage output conductor;
output amplifier circuitry, coupled to the input conductor, operative to amplify the input communication signal to provide an amplified feedforward signal;
a switching transistor coupled between the output amplifier circuitry and the signal combination circuitry, wherein the switching transistor is operative to provide the amplified feedforward signal to the signal combination circuitry only when the switching transistor is in conduction; and
a second-stage output conductor coupled to the signal combination circuitry, wherein the signal combination circuitry is operative to combine the amplified communication signal with the amplified feedforward signal onto the second-stage output conductor only when the switching transistor is in conduction.

5. The amplifier of claim 4, wherein the input amplifier circuitry and the output amplifier circuitry are inverting amplifiers.

6. The amplifier of claim 4, wherein the input amplifier circuitry includes a first transistor in a common-source configuration.

7. The amplifier of claim 6, wherein the input amplifier circuitry further includes a second transistor in a cascode configuration with the first transistor.

8. The amplifier of claim 4 wherein the signal combination circuitry includes a third transistor in a source-follower configuration.

9. The amplifier of claim 8, wherein the first-stage output conductor is coupled to a gate of the third transistor, and wherein the switching transistor and the second-stage output conductor are coupled to a source of the third transistor.

10. The amplifier of claim 4 wherein the output amplifier circuitry includes a field-effect transistor in a common-source configuration.

11. The amplifier of claim 10 wherein the field-effect transistor and the switching transistor are arranged in a cascode configuration.

12. The amplifier of claim 4, wherein each of the output stages has an output impedance, and wherein the output impedances of at least two of the output stages are different from one another.

13. The amplifier of claim 4, wherein each of the output stages has a power output, and wherein the power outputs of at least two of the output stages are different from one another.

14. The amplifier of claim 4, wherein the switching transistor is a bipolar junction transistor.

15. The amplifier of claim 4, wherein a base of the switching transistor is alternatively coupleable to a biasing potential or to ground, thereby bringing the switching transistor into or out of conduction, respectively.

16. An amplifier comprising:
   an input conductor for conducting an input communication signal;
   input amplifier circuitry operative to amplify the input communication signal and provide an amplified communication signal output to a first-stage output conductor, wherein the first-stage output conductor is resistively coupled to the signal input conductor; and
   a plurality of parallel output amplifier stages, wherein each of the output amplifier stages includes:
      a first field-effect transistor in a source-follower configuration with a gate coupled to the first-stage output conductor and a source coupled to a second-stage output conductor;
      a second field-effect transistor in a common-source configuration with a gate coupled to the input conductor; and
      a switching transistor with a collector coupled to the second-stage output conductor and an emitter coupled to a drain of the second field-effect transistor;
   wherein a base of the switching transistor is alternatively coupleable to a biasing potential or to ground, thereby bringing the switching transistor into or out of conduction, respectively.

17. The amplifier of claim 16, further comprising output stage biasing circuitry operative to provide a first biasing potential and a second biasing potential;
   wherein the switching transistors of the respective output stages are alternatively coupleable to the first biasing potential or to ground, thereby bringing the switching transistor into or out of conduction; and
   wherein the gates of the second field-effect transistors of the respective output stages are biased by the second biasing potential.

* * * * *